(12) United States Patent
Chen et al.

(10) Patent No.: US 7,544,603 B2
(45) Date of Patent: Jun. 9, 2009

(54) METHOD OF FABRICATING SILICON NITRIDE LAYER AND METHOD OF FABRICATING SEMICONDUCTOR DEVICE

(75) Inventors: Neng-Kuo Chen, Hsinchu (TW); Teng-Chun Tsai, Hsinchu (TW); Hsiu-Lien Liao, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 300 days.

(21) Appl. No.: 11/233,831

(22) Filed: Sep. 22, 2005

(65) Prior Publication Data

US 2007/0066022 A1 Mar. 22, 2007

(51) Int. Cl.
*H01L 21/20* (2006.01)

(52) U.S. Cl. ............... 438/622; 438/597; 438/605; 438/687; 438/707; 438/708; 257/E21.051; 257/E21.091; 257/E21.209; 257/E21.226; 257/E21.579; 257/E29.306

(58) Field of Classification Search ........... 438/458, 438/301, 597, 605, 622, 687, 707, 708, 763; 257/348, E21.133, E27.112, E21.051, 91, 257/209, 226, 579, 632, E29.306
See application file for complete search history.

(56) References Cited

U.S. PATENT DOCUMENTS

| | | | | |
|---|---|---|---|---|
| 4,840,876 A | * | 6/1989 | Arai | 430/328 |
| 5,029,130 A | * | 7/1991 | Yeh | 365/185.31 |
| 5,468,662 A | * | 11/1995 | Havemann | 438/151 |
| 5,470,799 A | * | 11/1995 | Itoh et al. | 438/708 |
| 5,927,992 A | * | 7/1999 | Hodges et al. | 438/439 |
| 5,994,192 A | * | 11/1999 | Chen | 438/303 |
| 6,319,809 B1 | * | 11/2001 | Chang et al. | 438/597 |
| 6,548,899 B2 | * | 4/2003 | Ross | 257/750 |
| 6,995,506 B2 | * | 2/2006 | Ogawa | 313/504 |
| 7,064,414 B2 | * | 6/2006 | Aitken et al. | 257/537 |
| 7,094,713 B1 | * | 8/2006 | Niu et al. | 438/795 |
| 7,102,722 B2 | * | 9/2006 | Kim et al. | 349/155 |
| 7,259,110 B2 | * | 8/2007 | Ohnuma et al. | 438/782 |
| 7,348,063 B2 | * | 3/2008 | Yamada et al. | 428/447 |
| 2005/0042889 A1 | * | 2/2005 | Lee et al. | 438/780 |

FOREIGN PATENT DOCUMENTS

| | | |
|---|---|---|
| CN | 1336688 | 2/2002 |
| CN | 1185022 | 6/2008 |
| JP | 63-239822 | * 10/1988 |

* cited by examiner

*Primary Examiner*—Michael S Lebentritt
(74) *Attorney, Agent, or Firm*—J.C. Patents

(57) ABSTRACT

A method of fabricating a silicon nitride layer is described. First, a substrate is provided. Then, a silicon nitride layer is formed on the substrate. The silicon nitride layer is UV-cured in an atmosphere lower than the standard atmospheric pressure. Through the UV curing treatment, the tensile stress of the silicon nitride layer is increased.

16 Claims, 7 Drawing Sheets

METHOD OF FABRICATING SILICON NITRIDE LAYER AND METHOD OF FABRICATING SEMICONDUCTOR DEVICE

BACKGROUND OF THE INVENTION

1. Field of the Invention

The present invention relates to a method of fabricating a silicon nitride layer. More particularly, the present invention relates to a method of fabricating a silicon nitride layer with a high tensile stress.

2. Description of the Related Art

As semiconductor production shifted into the sub-micron regime, methods that can increase the driving current of NMOS and PMOS have become increasingly important especially for processes involving a feature size below 65 nm. Any increase in the driving current of NMOS and PMOS can significantly improve the time delay in the operating device.

In recent years, many experts on semiconductor fabrication start to investigate the effects of a silicon nitride cap layer or silicon nitride etching stop layer with preloaded stress on the driving current of a device. Through such research, it has been found that a silicon nitride layer with tensile stress can increase the driving current of an NMOS transistor. Furthermore, the larger the tensile stress in the silicon nitride layer, the higher will be the increase in the driving current of the NMOS transistor.

The best film-plating technique currently available for forming a silicon nitride layer can provide a tensile stress of at most 1.2 GPa. However, the preferred tension in the silicon nitride layer often exceeds the value of 1.2 GPa. Therefore, in the conventional technique, a rapid thermal annealing (RTA) process or an ultra-violet (UV) curing treatment is frequently performed after forming the silicon nitride layer to increase the tensile stress.

Furthermore, the silicon nitride etching stop layer for forming a contact opening is formed after forming a metal silicide compound. Thus, if a rapid thermal annealing process is applied to increase the stress in the silicon nitride etching stop layer, the high temperature created by the rapid thermal annealing operation will adversely affect the properties of the metal silicide material.

In addition, the UV curing treatment on a silicon nitride layer is carried out at normal atmospheric pressure so that the increase in tensile stress in the silicon nitride layer is quite limited. Hence, the UV curing treatment can hardly meet the demands for higher tensile stress in most semiconductor fabrication processes.

Thus, it is a major goal for most semiconductor manufacturers to find a method capable of increasing the tensile stress of a silicon nitride layer to such an extent that the demands in most processes are met and the driving current of the semiconductor devices is increased.

SUMMARY OF THE INVENTION

Accordingly, at least one objective of the present invention is to provide a method of fabricating a silicon nitride layer that can effectively increase the tensile stress within the silicon nitride layer.

At least a second objective of the present invention is to provide a method of fabricating a semiconductor device that can effectively increase the driving current of the semiconductor device.

To achieve these and other advantages and in accordance with the purpose of the invention, as embodied and broadly described herein, the invention provides a method of fabricating a silicon nitride layer. First, a substrate is provided. Then, a silicon nitride layer is formed on the substrate. Thereafter, an ultraviolet curing treatment of the silicon nitride layer is performed in an atmosphere below the standard atmospheric pressure.

According to one preferred embodiment of the present invention, the sub-atmospheric pressure under which the silicon nitride layer is UV cured is between about 3 mTorr~500 Torr.

According to one preferred embodiment of the present invention, the sub-atmospheric pressure under which the silicon nitride layer is UV cured includes a vacuum.

According to one preferred embodiment of the present invention, the ultra-violet rays used in curing the silicon nitride layer have a wavelength between about 100 nm~400 nm.

According to one preferred embodiment of the present invention, the temperature in which the UV curing treatment of the silicon nitride layer is carried out is between about 150° C.~700° C.

According to one preferred embodiment of the present invention, the time period in which the UV curing treatment of the silicon nitride layer is carried out is between about 30 seconds~60 minutes.

According to one preferred embodiment of the present invention, the method of forming the silicon nitride layer includes performing a chemical vapor deposition process.

According to one preferred embodiment of the present invention, the aforementioned chemical vapor deposition process for forming the silicon nitride layer includes a plasma-enhanced chemical vapor deposition process, a low-pressure chemical vapor deposition process or an atomic layer chemical vapor deposition process.

The present invention also provides a method of fabricating a semiconductor device. First, a substrate is provided. Then, a gate dielectric layer is formed on the substrate. Thereafter, a gate is formed on the gate dielectric layer. Next, a source/drain region is formed in the substrate on respective sides of the gate. Afterwards, a first silicon nitride layer is formed over the substrate. Then, the first silicon nitride layer is ultraviolet (UV) cured in a sub-atmospheric pressure environment. After that, a dielectric layer is formed over the first silicon nitride layer. Then, a portion of the dielectric layer is removed to expose a portion of the first silicon nitride layer. The exposed first silicon nitride layer is removed to form a contact opening above the semiconductor device.

According aforementioned method of fabricating a semiconductor device in one preferred embodiment of the present invention, after forming the source/drain regions but before forming the first silicon nitride layer, further includes forming a metal silicide layer over the gate and the source/drain regions.

According aforementioned method of fabricating a semiconductor device in one preferred embodiment of the present invention, the method of forming the metal silicide layer includes forming a second silicon nitride layer over the substrate. Then, a portion of the second silicon nitride layer is removed to expose the gate and the source/drain regions. Thereafter, a metallic material layer is formed over the substrate to cover the gate and the source/drain regions. Next, a heat treatment is performed to produce a metal silicide layer over the gate and the source/drain regions. Then, the metallic material layer is removed. Finally, the second silicon nitride layer is removed.

According aforementioned method of fabricating a semiconductor device in one preferred embodiment of the present invention, after forming the second silicon nitride layer but before removing a portion of the second silicon nitride layer, further includes performing an ultraviolet curing treatment of the second silicon nitride layer in a sub-atmospheric pressure environment.

According aforementioned method of fabricating a semiconductor device in one preferred embodiment of the present invention, after forming the second silicon nitride layer but before removing a portion of the second silicon nitride layer, further includes performing a rapid thermal annealing process on the second silicon nitride layer.

According aforementioned method of fabricating a semiconductor device in one preferred embodiment of the present invention, the sub-atmospheric pressure is a pressure between 3 mTorr~500 Torr.

According aforementioned method of fabricating a semiconductor device in one preferred embodiment of the present invention, the sub-atmospheric pressure includes a vacuum.

According aforementioned method of fabricating a semiconductor device in one preferred embodiment of the present invention, the wavelength of the ultraviolet used in the curing treatment is between 100 nm~400 nm.

According aforementioned method of fabricating a semiconductor device in one preferred embodiment of the present invention, the temperature at which the ultraviolet curing treatment is carried out is between 150° C.~700° C.

According aforementioned method of fabricating a semiconductor device in one preferred embodiment of the present invention, the duration of the ultraviolet curing treatment is between 30 seconds~60 minutes.

According aforementioned method of fabricating a semiconductor device in one preferred embodiment of the present invention, the method of forming the first silicon nitride layer includes performing a chemical vapor deposition process.

According aforementioned method of fabricating a semiconductor device in one preferred embodiment of the present invention, the chemical vapor deposition process includes plasma-enhanced chemical vapor deposition process, low-pressure chemical vapor deposition process or atomic layer chemical vapor deposition process.

Since the ultraviolet curing treatment in the fabrication of silicon nitride layer provided in the present invention is carried out in a sub-atmospheric condition, overall tensile stress in the silicon nitride layer is increased.

Furthermore, since the semiconductor device fabricated according to the present invention can produce a silicon nitride layer with high tensile stress, the efficiency of electromigration in the semiconductor device is improved and the driving current is increased.

In addition, the process window in an etching operation can be effectively increased when the silicon nitride layer is used as an etching stop layer.

On the other hand, obtaining a high tensile stress in the silicon nitride layer by performing an ultraviolet curing treatment at a lower surrounding temperature can avoid possible temperature-induced damage to the metal silicide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
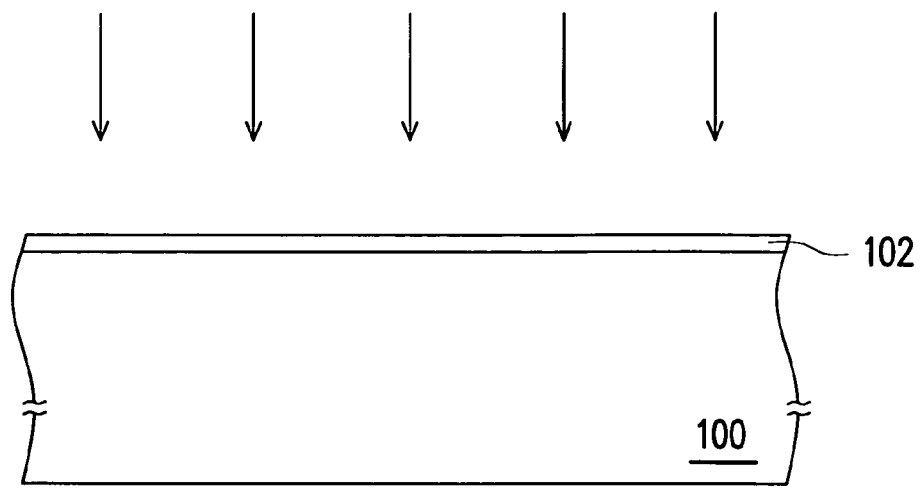
FIG. 1 is a schematic cross-sectional view of a silicon nitride layer according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a silicon nitride layer according to one embodiment of the present invention. As shown in FIG. 1, the method of fabricating the silicon nitride layer in the present invention includes providing a substrate 100 such as a silicon substrate. Then, a silicon nitride layer 102 is formed on the substrate 100. The silicon nitride layer 102 is formed by performing a chemical vapor deposition process, for example, such as a plasma-enhanced chemical vapor deposition process, a low-pressure chemical vapor deposition process or an atomic layer chemical vapor deposition process.

Thereafter, an ultraviolet curing treatment of the silicon nitride layer 102 is carried out in a sub-atmospheric pressure environment. The sub-atmospheric pressure is a pressure between about 3 mTorr~500 Torr, or for that matter, a vacuum. The wavelength of the ultraviolet light used in the curing treatment is between 100 nm~400 nm, for example. The ultraviolet curing treatment is carried out at a temperature between 150° C.~700° C. for a duration of between 30 seconds~60 minutes, for example.

Figure 2:
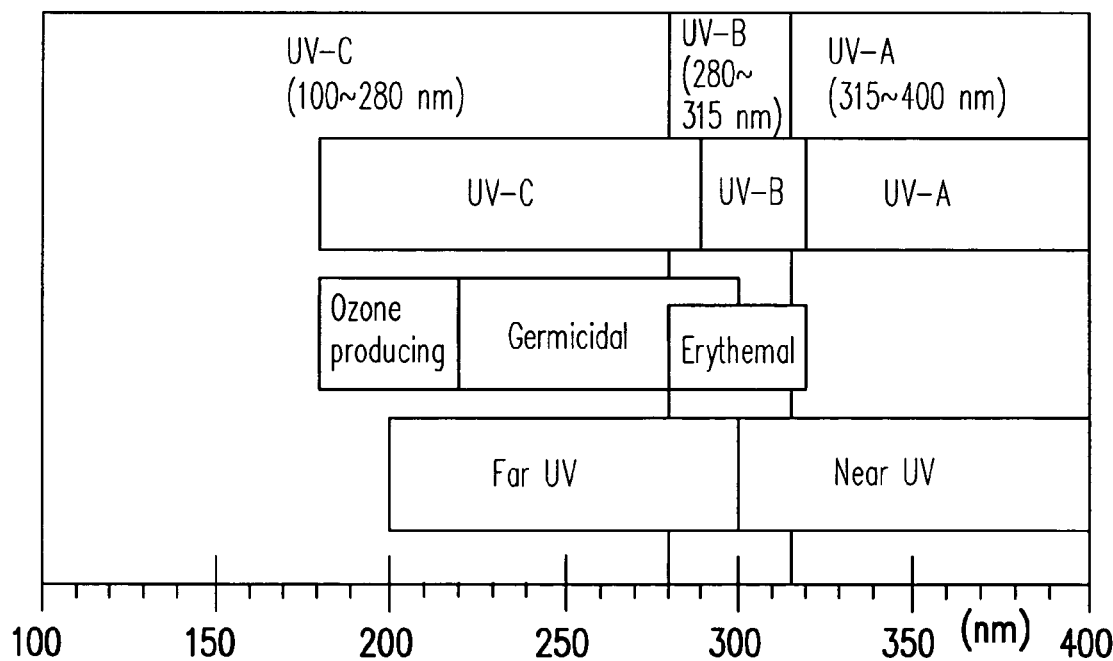
FIG. 2 is a diagram showing the wavelength distribution of ultraviolet light.

FIG. 2 is a diagram showing the wavelength distribution of ultraviolet light. As shown in FIG. 2, according to the Light Measurement Handbook (published by the International Light Company, whose authors are Ryer and Alex), the wavelength of ultraviolet (UV) light is divided into ultraviolet A (UV-A), ultraviolet B (UV-B) and ultraviolet C (UV-C) according to its effects on living things. The wavelength of UV-A is in the range 315 nm~400 nm, the wavelength of UV-B is in the range 280 nm~315 nm and the wavelength of UV-C is in the range 100 nm~280 nm. The atmosphere can absorb the strongest ultraviolet radiation, which is UV-C, to generate ozone ($O_3$).

Table 1 shows the bond energies needed to break a few chemical bonds and associated wavelength of the ultraviolet light. The reason for performing an ultraviolet curing treatment of the silicon nitride layer 102 is that only ultraviolet light has sufficient energy to break the Si—H and SiN—H bonds and release the hydrogen (H) atoms from the silicon nitride layer 102. Ultimately, the tensile stress of the silicon nitride layer is strengthened. When the wavelength of the ultraviolet light is smaller than 400 nm, the Si—H and SiN—H bonds can be broken. Furthermore, the lower the wavelength of the UV light, the stronger is the energy contained in the UV light. Hence, the tensile stress in the silicon nitride layer 102 after the UV curing treatment is larger.

TABLE 1 the energy needed to break down chemical bonds and the wavelength of associated ultraviolet light

| Chemical bonds | Energy (KJ/mole) | Wavelength of UV light (nm) |
| --- | --- | --- |
| Si—H | 299 | 399.8 |
| SiN—H | 339 | 350 |

The conventional ultraviolet curing treatment is carried out in a standard atmospheric pressure condition so that the strongest ultraviolet light, the UV-C, will be absorbed by the atmosphere to produce ozone ($O_3$).

In the present invention, the UV curing treatment of the silicon nitride layer 102 is carried out in sub-atmospheric pressure condition, for example, such as a pressure between 3 mTorr~500 Torr or in a vacuum so that the absorption of UV-C by surrounding air is suppressed. In other words, the UV curing treatment in the process of fabricating the silicon nitride layer according to the present invention can utilize the UV-A, UV-B and the ultraviolet light with the highest energy UV-C fully to break down the Si—H and SiN—H bonds. Thus, the tensile stress of the silicon nitride layer 102 is significantly increased.

Figure 3A:
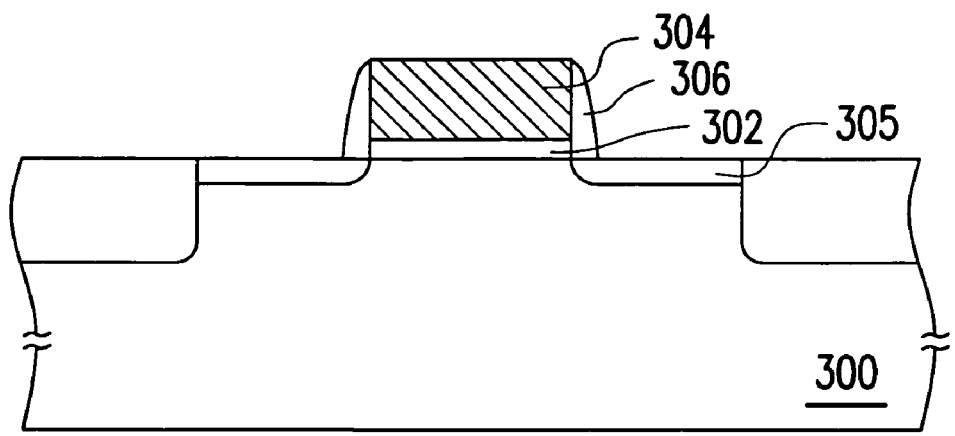
FIGS. 3A through 3E are schematic cross-sectional views showing the steps for fabricating a semiconductor device according to one embodiment of the present invention.

FIGS. 3A through 3E are schematic cross-sectional views showing the steps for fabricating a semiconductor device according to one embodiment of the present invention. First, as shown in FIG. 3A, a substrate 300 such as a silicon substrate is provided. Then, a gate dielectric layer 302 is formed on the substrate 300. The gate dielectric layer 302 is fabricated using silicon oxide, for example. The method of forming the gate dielectric layer 302 includes, for example, performing a thermal oxidation. Then, a gate 304 is formed on the gate dielectric layer 302. The gate 304 is a doped polysilicon layer formed, for example, by performing a chemical vapor deposition process with in-situ doping to produce a doped polysilicon material layer (not shown) and performing a patterning process thereafter. And then, source/drain extend region 305 is formed in the substrate 300 on the respective sides of the gate 304. The source/drain extend region 305 is formed by performing an ion implant process, for example. After that, spacers 306 can be formed on the substrate 300 on respective sides of the gate 304. The spacers 306 can be fabricated using silicon nitride, for example. The method of forming the spacers 306 includes depositing spacer material in a chemical vapor deposition process to form a spacer material layer (not shown) and performing an etching back operation thereafter.

Figure 3B:
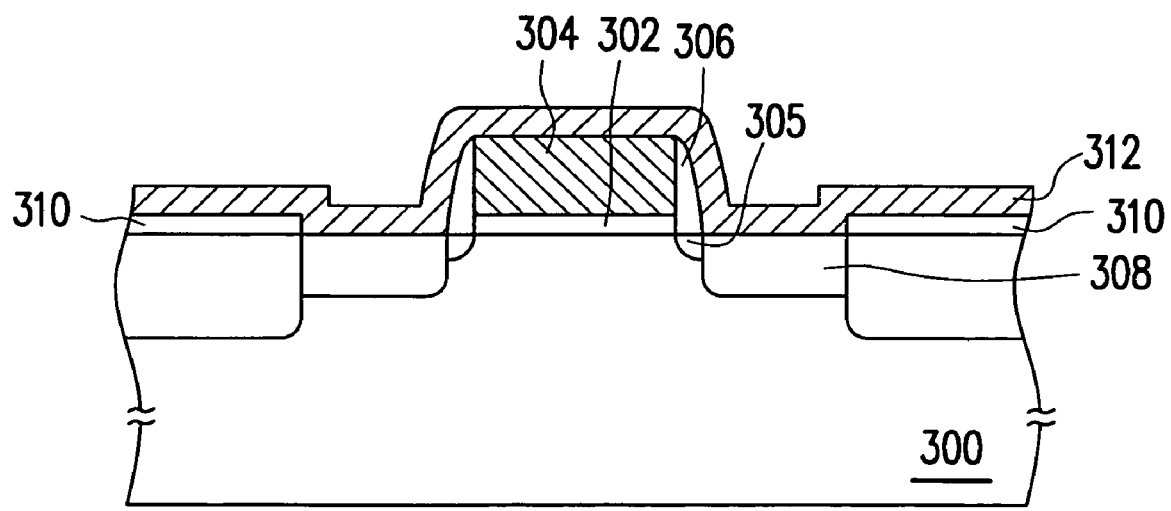

As shown in FIG. 3B, a source/drain region 308 is formed in the substrate 300 on the respective sides of the gate 304. The source/drain region 308 is formed by performing an ion implant process, for example.

Thereafter, a silicon nitride layer 310 may form over the substrate 300. The silicon nitride layer 310 serves as a stressed layer, for example. The silicon nitride layer 310 is formed by performing a chemical vapor deposition process, for example, including, a plasma-enhanced chemical vapor deposition process, a low-pressure chemical vapor deposition process or an atomic layer chemical vapor deposition process. Furthermore, an additional treatment of the silicon nitride layer 310 may be performed after forming the silicon nitride layer 310 over the substrate 300 so that tensile stress of the silicon nitride layer 310 is increased. Here, the treatment of the silicon nitride layer 310 can be a rapid thermal annealing (RTA) operation. Alternatively, the treatment can be an ultraviolet curing treatment of the silicon nitride layer 310 in a sub-atmospheric pressure environment. The sub-atmospheric pressure is a pressure between 3 mTorr~500 Torr, or even a vacuum, for example. The wavelength of the ultraviolet light used in the UV curing treatment is between 100 nm~400 nm, for example. Furthermore, the UV curing treatment is carried out at a temperature between 150° C.~700° C. for a duration of between 30 seconds~60 minutes, for example.

Then, a portion of the silicon nitride layer 310 is removed to expose the gate 304 and the source/drain regions 306. The method of removing a portion of the silicon nitride layer 310 includes, for example, performing a patterning operation. After that, a metallic material layer 312 is formed over the substrate 300. The metallic material layer 312 covers the gate 304 and the source/drain regions 306. The metallic material layer 312 is fabricated using nickel, tungsten, cobalt, titanium, molybdenum or platinum and is formed by performing a physical vapor deposition process, for example.

Figure 3C:
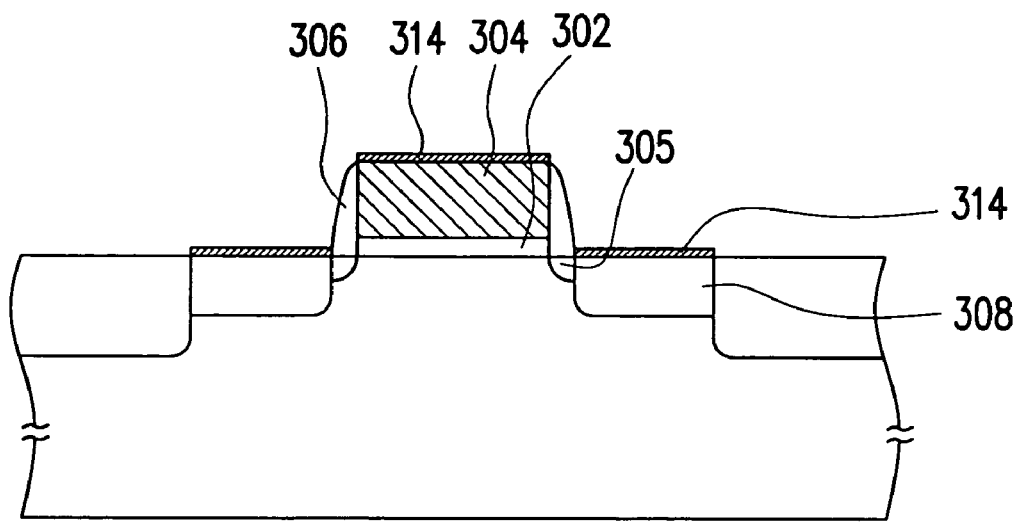

As shown in FIG. 3C, a heat treatment is performed to form a metal silicide layer 314 over the gate 304 and the source/drain regions 306. The metal silicide layer 314 is a nickel silicide layer, a tungsten silicide layer, a cobalt silicide layer, a titanium silicide layer, a molybdenum silicide layer or a platinum silicide layer, for example. Then, the metallic material layer 312 is removed. After that, the silicon nitride layer 310 is also removed. In general, anyone with sufficient knowledge in this technical area can decide whether to form the silicon nitride layer 310 or not according to the actual need in the fabrication of the metal silicide layer 314. It should be noted that the tensile stress would increase with the formation of the silicon nitride layer 310.

Figure 3D:
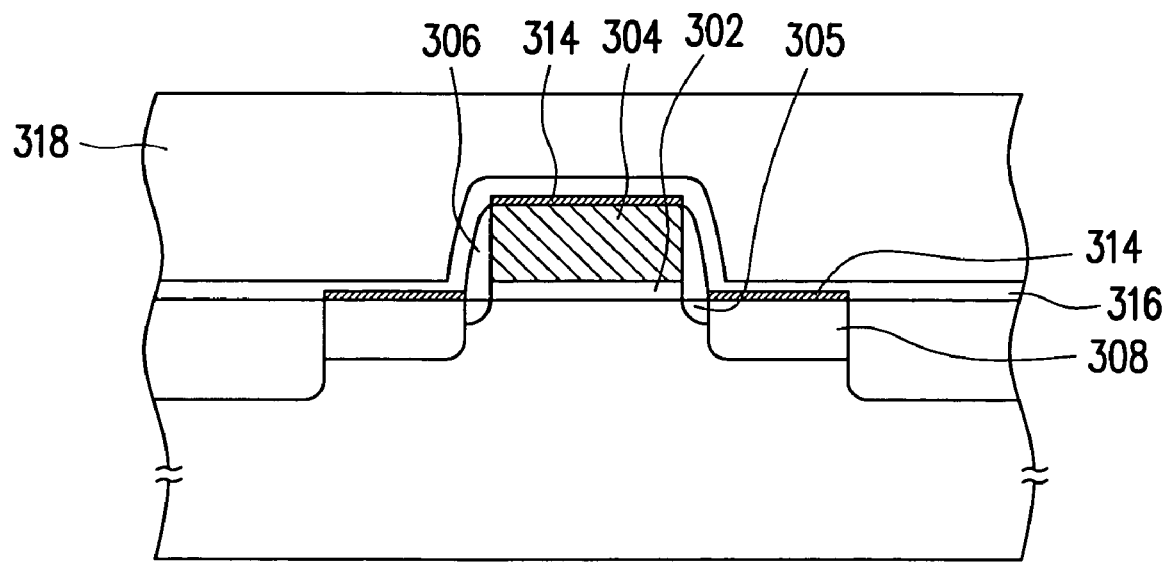

As shown in FIG. 3D, another silicon nitride layer 316 is formed over the substrate 300. The silicon nitride layer 316 serves as an etching stop layer, for example. The silicon nitride layer 316 is formed by performing a chemical vapor deposition process, for example, including a plasma-enhanced chemical vapor deposition process, a low-pressure chemical vapor deposition process or an atomic layer chemical vapor deposition process.

Thereafter, an ultraviolet (UV) curing treatment of the silicon nitride layer 316 is performed in a sub-atmospheric pressure. The sub-atmospheric pressure is between 3 mTorr~500 Torr, or even a vacuum, for example. The wavelength of the ultraviolet light is between 100 nm~400 nm, for example. The UV curing treatment is carried out at a surrounding temperature between 150° C.~700° C. for a duration of between 30 seconds~60 minutes, for example.

Figure 3E:
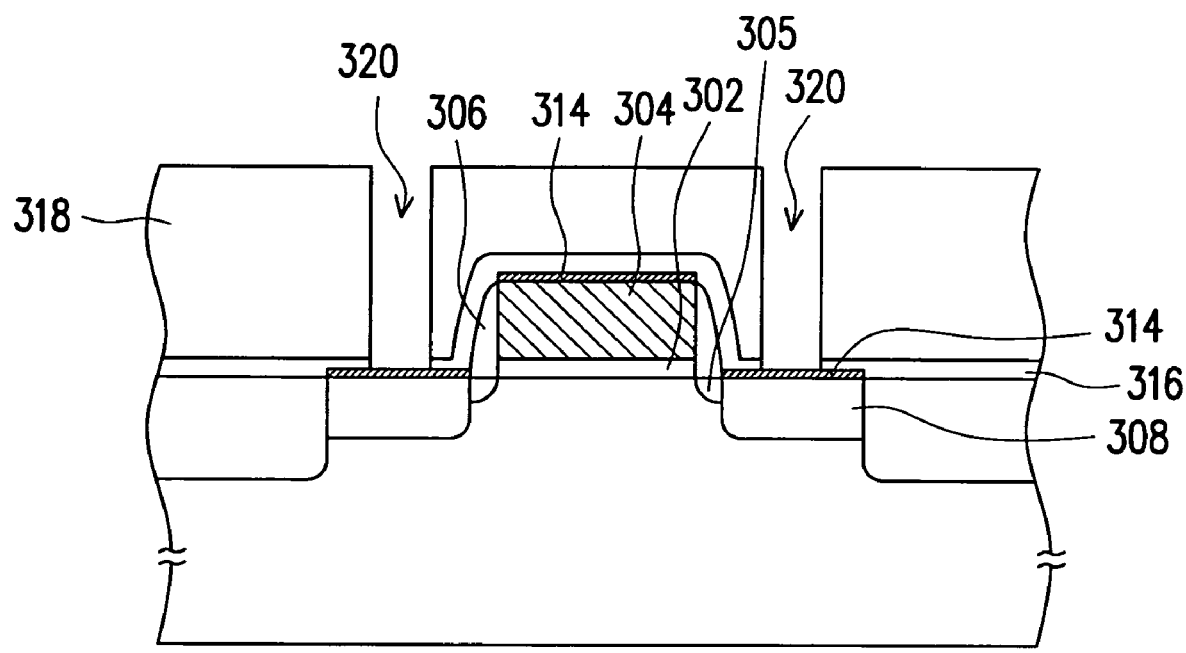

As shown in FIG. 3E, a dielectric layer 318 is formed over the silicon nitride layer 316. The dielectric layer 318 is a silicon oxide layer, for example. The method of forming the dielectric layer 318 includes performing a chemical vapor deposition process, for example. Then, a portion of the dielectric layer 318 is removed to expose a portion of the silicon nitride layer 316. Thereafter, the exposed silicon nitride layer 316 is removed to form a contact opening 320 above the semiconductor device. The method of removing the dielectric layer 318 and the silicon nitride layer 316 includes performing a photolithographic process and an etching process in sequence, for example. Since subsequent processes for fabricating a complete semiconductor device should be familiar those knowledgeable in this field, a detailed description is omitted here.

The silicon nitride layer 310 and the silicon nitride layer 316 in the semiconductor device fabricated according to the present invention are film layers with a rather high tensile stress. Therefore, the electro-migration properties are improved so that the driving current provided by the semiconductor device is increased. In addition, because the silicon nitride layer 316 can be UV cured at a rather low temperature (between 150° C.~700° C.), possible damage to the metal silicide layer 314 through heat can be avoided.

In the following, actual experimental tests are carried out to explain the performance of the semiconductor device fabricated using the method of the present invention.

Figure 4:
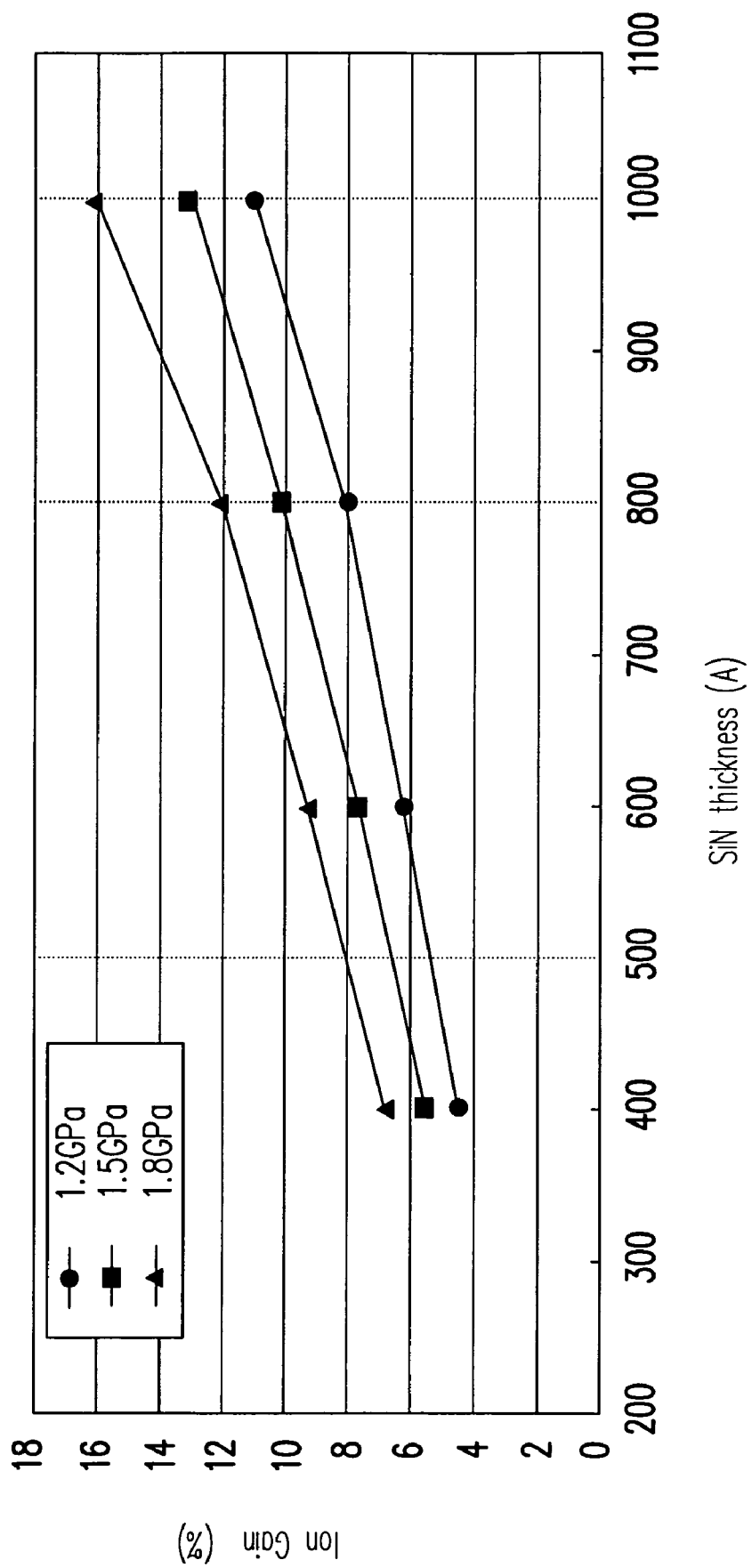
FIG. 4 is a graph showing the curves relating the thickness of the silicon nitride layer to the percentage increase in current.

FIG. 4 is a graph showing the curves relating the thickness of the silicon nitride layer to the percentage increase in current. As shown in FIG. 4, the required thickness of the silicon nitride layer for an 8% increase in current when the tensile stress in the silicon nitride layer is 1.2 Gpa is 800 Å. When the tensile stress of the silicon nitride layer is increased to 1.5 Gpa, the required thickness of the silicon nitride layer is 620 Å. When the tensile stress of the silicon nitride layer is increased to 1.8 Gpa, the required thickness of the silicon layer is 500 Å. In other words, the higher the tensile stress of the silicon nitride layer, a thinner film layer is required to attain the same rate of increase in current. Accordingly, because the present invention can increase the tensile stress of the silicon nitride layer to reduce the thickness of the silicon nitride layer when the silicon nitride layer is used as an etching stopping layer, the process window of the etching operation is effectively increased.

Figure 5:
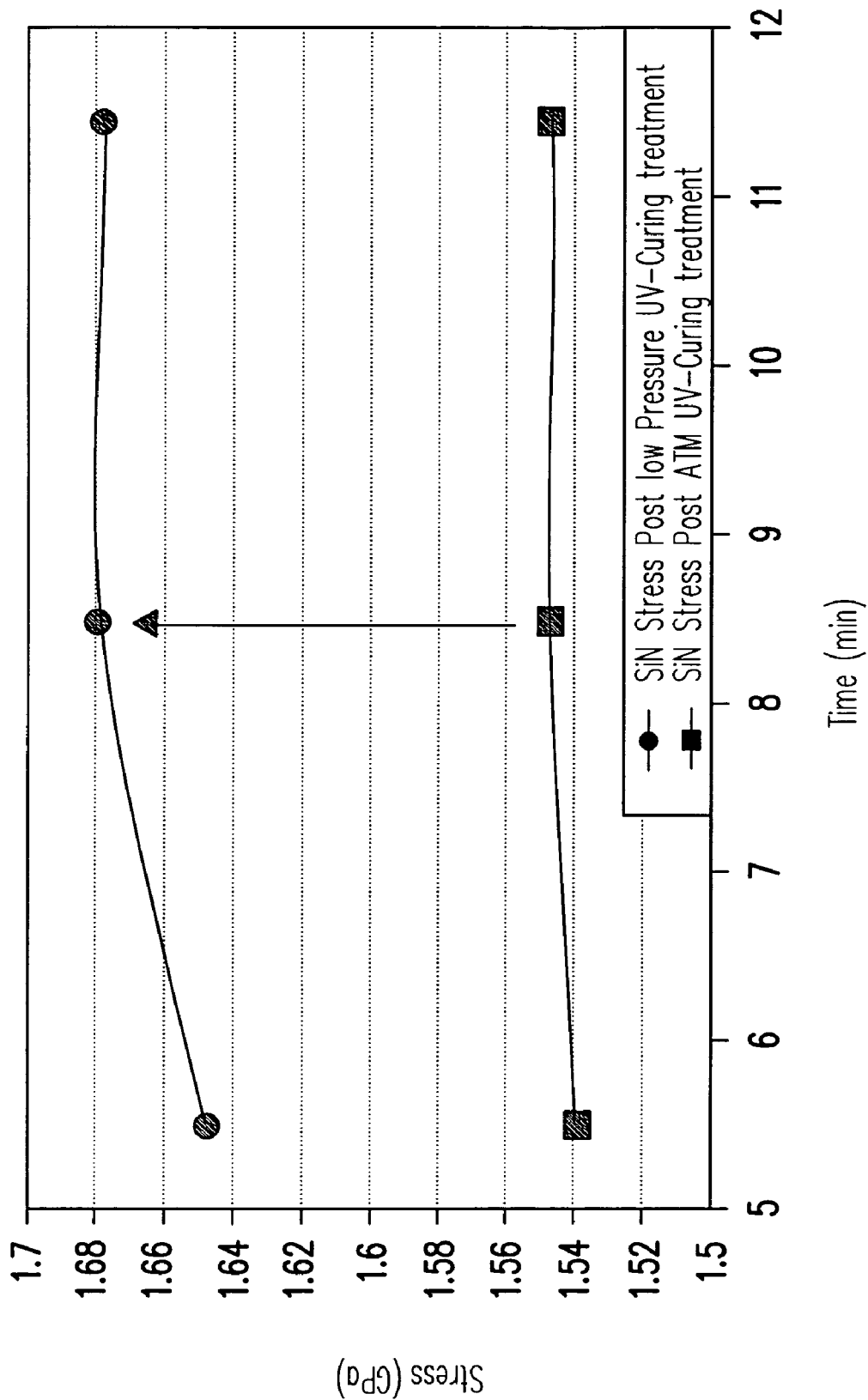
FIG. 5 is a graph showing the curves relating the duration of ultraviolet illumination to the tensile stress in the silicon nitride layer.

FIG. 5 is a graph showing the curves relating the duration of ultraviolet illumination to the tensile stress in the silicon nitride layer. As shown in FIG. 5, after performing an UV curing treatment of the silicon nitride layer at normal atmospheric pressure at a temperatures of 400 C for 12 seconds, the tensile stress of the silicon nitride layer is 1.54 Gpa. On the other hand, after performing the same UV curing treatment in sub-atmospheric pressure (vacuum, for example), the tensile stress of the silicon nitride layer is 1.68 Gpa. Accordingly, performing the ultraviolet curing treatment in a sub-atmospheric pressure can effectively increase the tensile stress of the silicon nitride layer.

Figure 6:
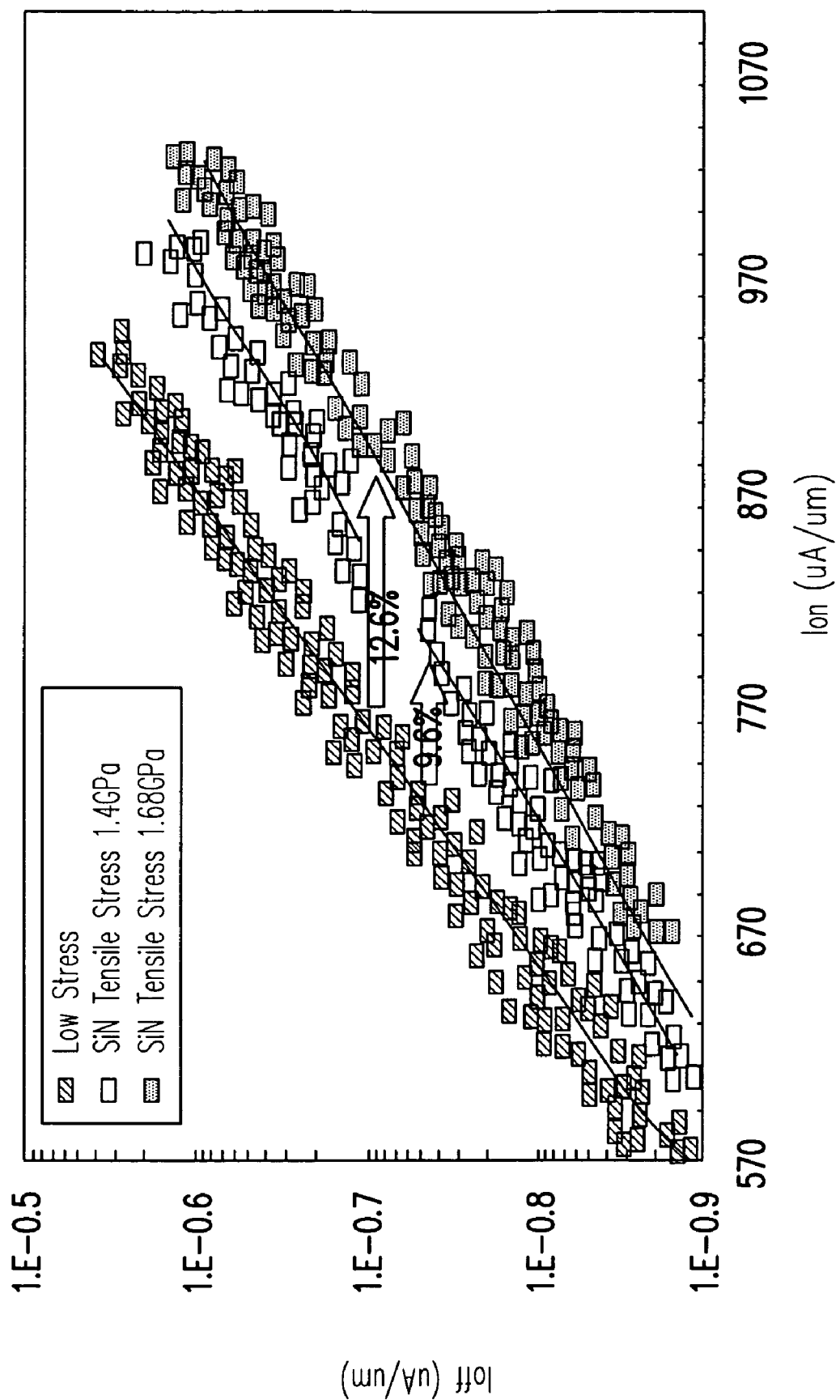
FIG. 6 is a graph showing the curves relating the shutdown current to the turn-on current.

FIG. 6 is a graph showing the curves relating the shutdown current to the turn-on current. As shown in FIG. 6, when the silicon nitride layer is used as an etching stop layer such that the silicon nitride layer has a thickness of 800 Å and a shutdown current (Ioff) of $1\times10^{-7}$, the turn-on current (Ion) of the silicon nitride layer with a tensile stress of 1.4 Gpa is 9.6% higher than the turn-on current (Ion) of a silicon nitride layer with a low tensile stress. Similarly, the turn-on current (Ion) of the silicon nitride layer with a tensile stress of 1.68 Gpa is 12.6% higher than the turn-on current (Ion) of a silicon nitride layer with a low tensile stress. Accordingly, the high tensile stress silicon nitride layer fabricated according to the present invention can significantly increase the turn-on current.

In summary, the present invention has at least the following advantages:

1. In the method of fabricating the silicon nitride layer according to the present invention, the ultraviolet curing treatment for the silicon nitride layer is performed at a sub-atmospheric pressure. Hence, the surrounding air will not absorb the high-energy UV-C rays so that the tensile stress of the silicon nitride layer can be increased.

2. The semiconductor device fabrication method according to the present invention can produce a silicon nitride layer with high tensile stress. Therefore, electro-migration properties can be improved and the driving current of the semiconductor device can be increased.

3. When the silicon nitride layer serves as an etching stop layer in the method of fabricating the semiconductor device according to the present invention, the process window of the etching operation is significantly increased.

4. Since the high tensile stress silicon nitride layer in the process of fabricating the semiconductor device according to the present invention is formed by performing an ultraviolet curing treatment at a moderately low environmental temperature, possible damage to a metal silicide due to heat is avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a silicon nitride layer, comprising the steps of:
   providing a substrate;
   forming a silicon nitride layer on the substrate; and
   performing an ultraviolet curing treatment of the silicon nitride layer at sub-atmospheric pressure environment, wherein the ultraviolet at least includes UV-C, and the sub-atmospheric pressure environment is a surrounding pressure of between 3 mTorr~500 Torr or a vacuum.

2. The method of fabricating a silicon nitride layer of claim 1, wherein the wavelength of the ultraviolet light used in the curing treatment is between 100 nm~400 nm.

3. The method of fabricating a silicon nitride layer of claim 1, wherein the ultraviolet curing treatment is carried out at a temperature between 150° C.~700° C.

4. The method of fabricating a silicon nitride layer of claim 1, wherein the duration of the ultraviolet curing treatment is between 30 seconds~60 minutes.

5. The method of fabricating a silicon nitride layer of claim 1, wherein the step for forming the silicon nitride layer on the substrate includes performing a chemical vapor deposition process.

6. The method of fabricating a silicon nitride layer of claim 1, wherein the chemical vapor deposition process includes a plasma-enhanced chemical vapor deposition process, a low-pressure chemical vapor deposition process or an atomic layer chemical vapor deposition process.

7. A method of fabricating a semiconductor device, comprising the steps of:
   providing a substrate;
   forming a gate dielectric layer on the substrate;
   forming a gate on the gate dielectric layer;
   forming a source/drain region in the substrate on the respective sides of the gate;
   forming a first silicon nitride layer on the substrate;
   performing an ultraviolet curing treatment of the first silicon nitride layer in a sub-atmospheric pressure environment;
   forming a dielectric layer on the first silicon nitride layer;
   removing a portion of the dielectric layer to expose a portion of the first silicon nitride layer; and
   removing the exposed first silicon nitride layer to form a contact opening above the semiconductor device, wherein the ultraviolet at least includes UV-C, and the sub-atmospheric pressure environment is a surrounding pressure of between 3 mTorr~500 Torr or a vacuum.

8. The method of fabricating a semiconductor device of claim 7, wherein after forming the source/drain regions but before forming the first silicon nitride layer, further includes forming a metal silicide layer on the gate and the source/drain regions.

9. The method of fabricating a semiconductor device of claim 8, wherein the step for forming the metal silicide layer comprises:
   forming a second silicon nitride layer over the substrate;
   removing a portion of the second silicon nitride layer to expose the gate and the source/drain regions;
   forming a metallic material layer over the substrate to cover the gate and the source/drain regions;
   performing a heat treatment to form a metal silicide layer over the gate and the source/drain regions;
   removing the metallic material layer; and
   removing the second silicon nitride layer.

10. The method of fabricating a semiconductor device of claim 9, wherein after forming the second silicon nitride layer but before removing a portion of the second silicon nitride layer, further includes performing an ultraviolet curing treatment of the second silicon nitride layer in a sub-atmospheric pressure environment.

11. The method of fabricating a semiconductor device of claim 9, wherein after forming the second silicon nitride layer but before removing a portion of the second silicon nitride layer, further includes performing a rapid thermal annealing process on the second silicon nitride layer.

12. The method of fabricating a semiconductor device of claim 7, wherein the wavelength of the ultraviolet light used in the curing treatment is between 100 nm~400 nm.

13. The method of fabricating a semiconductor device of claim 7, wherein the ultraviolet curing treatment is carried out at a temperature between 150° C.~700° C.

14. The method of fabricating a semiconductor device of claim 7, wherein the duration of the ultraviolet curing treatment is between 30 seconds~60 minutes.

15. The method of fabricating a semiconductor device of claim 7, wherein the step for forming the second silicon nitride layer includes performing a chemical vapor deposition process.

16. The method of fabricating a semiconductor device of claim 7, wherein the chemical vapor deposition process includes a plasma-enhanced chemical vapor deposition process, a low-pressure chemical vapor deposition process or an atomic layer chemical vapor deposition process.

* * * * *